United States Patent [19]

Aichelmann, Jr. et al.

[11] Patent Number: 4,506,364
[45] Date of Patent: Mar. 19, 1985

[54] MEMORY ADDRESS PERMUTATION APPARATUS

[75] Inventors: Frederick J. Aichelmann, Jr., Hopewell Junction; Lawrence K. Lange, Wappingers Falls, both of N.Y.

[73] Assignee: International Business Machines Corporation, Armonk, N.Y.

[21] Appl. No.: 429,644

[22] Filed: Sep. 30, 1982

[51] Int. Cl.³ .............. G06F 11/10; G11C 29/00
[52] U.S. Cl. .............................. 371/38; 371/10; 371/13; 364/900
[58] Field of Search .......... 371/10, 13, 38, 51, 371/50; 364/200, 900

[56] References Cited

U.S. PATENT DOCUMENTS

| | | | |
|---|---|---|---|
| 3,644,902 | 2/1972 | Beausoleil | 371/2 |
| 3,781,826 | 12/1973 | Beausoleil | 371/10 |
| 3,812,336 | 5/1974 | Bossen et al. | 371/38 |
| 3,897,626 | 8/1975 | Beausoleil | 371/38 |
| 3,983,537 | 9/1976 | Parsons et al. | 371/10 X |
| 3,995,261 | 10/1976 | Goldberg | 371/10 X |
| 4,028,539 | 6/1977 | Jacobs | 371/10 |
| 4,051,460 | 9/1977 | Yamada et al. | 371/10 X |
| 4,335,458 | 6/1982 | Krol | 371/38 |
| 4,394,763 | 7/1983 | Nagano et al. | 371/38 |
| 4,430,727 | 2/1984 | Moore et al. | 371/10 X |
| 4,450,559 | 5/1984 | Bond et al. | 371/10 X |
| 4,453,251 | 6/1984 | Osman | 371/38 X |

*Primary Examiner*—Jerry Smith
*Assistant Examiner*—Michael R. Fleming
*Attorney, Agent, or Firm*—James E. Murray

[57] ABSTRACT

Swapping of bits between different words of a memory is accomplished by a single permutation means. The single permutation means generates actual address bits for all the bit positions in a memory word. These actual address bits are in a local store. Each time a memory word is accessing the locations of the bits are substituted for logical address bits and fed to the decoders of the different bit positions in the memory word being accessed.

6 Claims, 9 Drawing Figures

MEMORY SYSTEM

FIG. 2a  MEMORY ARRAY GROUP

FIG. 5  MEMORY FAULT MAP

FIG. 4

FIG. 6
FAULT MAPPING

FIG. 7 REALIGNMENT

MEMORY ADDRESS PERMUTATION APPARATUS

BACKGROUND OF THE INVENTION

The present invention relates to the automatic skewing of addresses in a memory to change memory words with uncorrectable errors into memory words with errors that can be corrected by the error correction code protecting the memory.

Error correction and detection schemes for encoding data are known to detect more errors than they are capable of correcting. For instance, a 64 data bit word can be provided with a single error correction and a double error detection capability by using eight check bits which are stored in the same word location in memory as the 64 data bits. A failure of any single one of the 72 cells which store the data and check bits can be corrected by error correcting circuitry. This same circuitry can also be used to detect double errors existing in the word but generally will not correct these double errors. That is, if a single bit fails the particular defective bit can be identified and, therefore, corrected. However, if two bits fail the occurrence of the failure can be detected but the failing bits generally cannot be pinpointed and, therefore, cannot be corrected.

The term "generally" has been used in connection with double error correction because some of the single error correction codes do correct specific types of double errors such as errors in adjacent bit positions. However, not all double errors will occur in a correctable pattern. Therefore, to repeat what has already been said, an error correction system generally speaking will detect a greater number of errors than it has the capability of automatically correcting.

To take advantage of this capacity of an error correction code to detect more errors than it can correct, Beausoleil, U.S. Pat. No. 3,644,902 suggests a means for changing errors that are detectable but uncorrectable into errors that are both detectable and correctable. In the Beausoleil patent, a memory unit is made up of a plurality of arrays each containing all the bits for one bit position in the memory unit. These arrays are each addressed through a decoder so that the proper bit of any word is selected from each array when the word is addressed. The Beausoleil patents suggests that, when multiple errors are to be avoided, circuitry be employed that permanently modifies the address supplied to the decoders to swap bits between words by physically swapping the arrays and thereby change words with uncorrectable errors into words with correctable errors.

In Bossen et al, U.S. Pat. No. 3,812,336, and in an article entitled "Address Reconfiguration for Large-Scale Integrated Memory Yield Inducement", appearing on page 1245 of the September 1973 issue of the IBM Technical Disclosure Bulletin, an address modification scheme was proposed to form electronic swapping of memory bits. In this scheme the address supplied to the decoder of any particular bit array is modified by logic circuitry as a function of data stored in a shift register associated with the particular bit position of the words in the memory unit. The logic circuitry controlled by each of the registers includes an Exclusive OR gate for each of the inputs of the decoder of the particular bit position. Each of the Exclusive OR gates accepts one digit of the word address and the output of one of the stages of the linear feedback shift register and supplied its output to one of the inputs of the decoder. In the IBM Technical Disclosure Bulletin article, the decoder input address of the bad bit is placed in the shift register so that when the bad bit is requested bit location 0 is accessed instead. In the Bossen et al patent, a different Galois field number is stored in each of the shift registers starting with zero in the shift register of the first bit position and proceeding in the Galois field number sequence to the highest number needed in the shift register of the last bit position. Each time a multiple error is detected, each of the shift registers, except the shift register for the first bit position, is shifted one Galois number. This assures that the detected multiple error will be eliminated by scattering the bits making up the failing word. As a result of this scattering, each of the failing bits end up in a different word changing the uncorrectable multiple error condition into a number of correctable single error conditions. Test results pointing to the location of bad bits are used in Beausoleil patents, U.S. Pat. Nos. 3,781,826 and 3,897,626 to divide chips into groups in accordance with the location of the failing bits. In U.S. Pat. No. 3,897,626, these chips are mounted in memory cards with all chips having a defective chip in a given chip section being mounted on a corresponding section of a card. The address wiring is then used to skew the errors so that no memory word contains more than one bad bit. If a failure is detected by an ECC system, an Exclusive ORing of two sections of the address of the failing word will locate the bad or suspicious bit.

In U.S. patent application, Ser. No. 362,925, filed Mar. 29, 1982, now U.S. Pat. No. 4,461,001 and entitled "Deterministic Permutation Algorithm:, the swapping of bits between different words of a memory is accomplished by using data on bad bits in the memory. The permutation of the bit addresses is done by an exclusionary process which identifies address combinations which result in alignment of bit failures that are uncorrectable by the error correction system of the memory and then limiting the selection process to other combinations. In the preferred embodiment, failures are categorized by type, such as chip, line or bit failure to determine uncorrectable combinations of failures. The bit addresses are then permutted in order of decreasing number of failures.

BRIEF DESCRIPTION OF THE INVENTION

In accordance with the present invention, the swapping of bad bits between different words of a memory is accomplished by a new permutation mechanism in the memory. In the mentioned U.S. patent application, Ser. No. 362,925, the same address is sent to all addressable units of memory storage used to store a cord word. Permutation apparatus is then provided in these units to change the address selected in the particular unit. In the present arrangement, a single permutation apparatus is located upstream of the addressable units to memory storage it selects. It then provides a different address to units that are permuted. This reduces the hardware required for an array card increasing the reliability of those array cards and reducing the redundancy of permutation apparatus. It also permits the use of more straight forward algorithms that are not restricted by limitations of the permutation apparatus on the card.

Therefore, it is an object of the present invention to provide new permutation apparatus for swapping bits in memory words to change uncorrectable error conditions into correctable error conditions.

It is another object of the present invention to swap bits in memory words using fault data on bad cells in the memory.

An additional object of the invention is to swap bits in memory words based on known error conditions existing in the memory categorized by the type of error.

THE DRAWINGS

This and other objects of the present invention can be best understood by reference to the figures of the drawings of which:

FIG. 1a is a schematic of a memory employing the present invention;

FIG. 1b is a timing diagram related to FIG. 1a.

FIG. 2b is a timing diagram related to FIG. 2a.

DETAILED DESCRIPTION

Figures 1A, 1B:
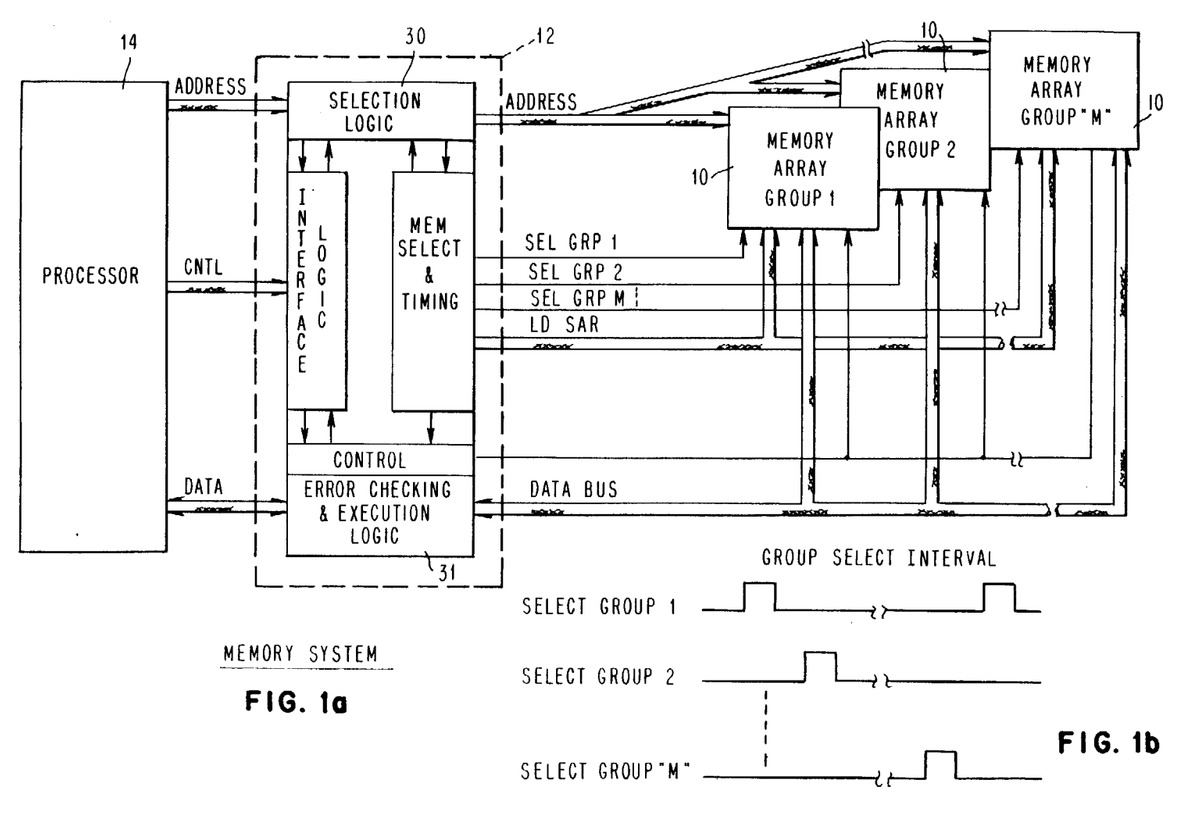

Referring to FIG. 1, a basic storage module (BSM) of a word oriented memory contains array groups each containing one or more bit positions of a k bit ECC codeword. All the array groups 10 are serviced by a common storage service subsystem 12 which is an interface between the memory array groups 10 and one of more processors 14. The storage service subsystem receives address data and control information from the processor 14 and generates address and control signals for the memory array groups.

Memory array groups 10 are addressed one at a time to allow different addresses to be supplied to each of the array groups. Time differentiation is accomplished by using a different group select pulse to access each memory array group 10. While each address is transmitted universally to all the array groups, each of the m group select pulses goes to only one of memory array groups assuring only one of the array groups is accessed by the transmitted address.

Figure 2A:
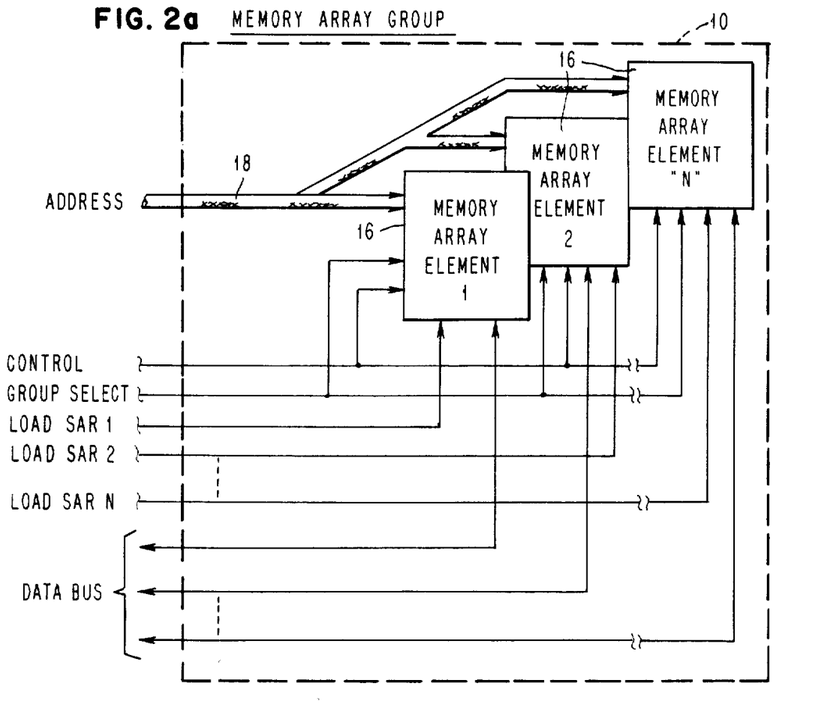
FIG. 2a is a more detailed schematic of one of the array groups in FIG. 1.
Figure 2B:
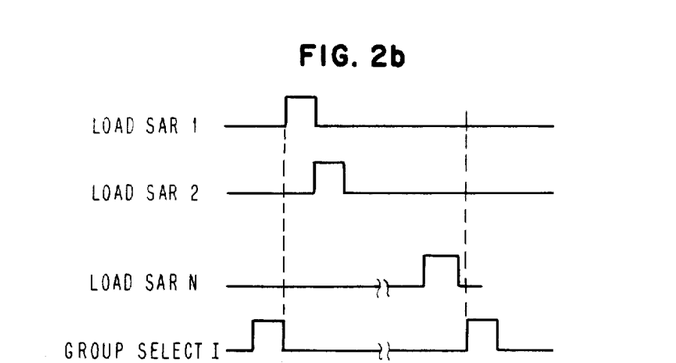

Each memory array group 10 contains N memory array elements. As shown in FIG. 2, these memory elements 16 each receive an address from the storage service module 12 along with the group select pulse and one of N Load storage address register (SAR) pulses. Selective address may depend upon only one active SAR at a time within a selected group so that during any address cycle one memory array element 16 in one memory element group 10 is selected and all other memory elements 16 in all other groups 10 are not selected at that time.

Figure 3:
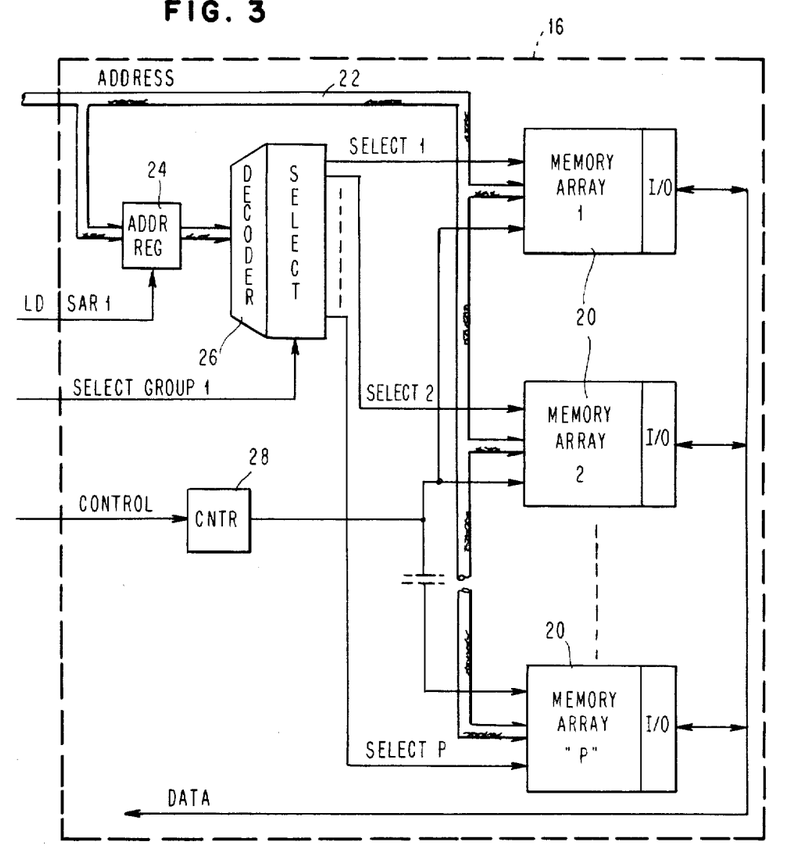
FIG. 3 is a more detailed schematic of one of the array elements of FIG. 2 in accordance with the present invention.

As shown in FIG. 3 the bits in each memory element 16 are divided into P separate arrays 20. The low order address bits 18 are array X and Y coordinate select pulses that are sent to each of the arrays 20 to select one bit. The higher order address bits sent to the element 16 are divided into three fields one being the array select field which loaded into the storage address register (SAR) 24 when the SAR receives the appropriate load SAR pulse. The contents of the SAR 24 are fed into an array select decoder 26 which generates an array select pulse that selects one of the arrays 20 in each of the memory array elements 16. The next occurrance of the group select pulse for the group containing the particular array enables the transmission of that select pulse to the proper array 20. Therefore only one of the arrays 20 of memory elements is selected to receive an address during each group select pulse. Since each array 20 in the memory can be addressed individually on the common address bus 18, permutation of the select address is possible. In the described embodiment of the invention, each memory element 16 contains bits of only one bit position of the ECC word, the particular bit selected can be in any one of the P arrays 20 depending on the address data supplied to decoder 26.

Therefore, a word is addressed by presenting a chip select to all the SARs 24 and an X-Y coordinate address to each of the array elements 16 in all the array groups 10 in the BSM. Select group and Load SAR pulses assure that only one element in one group is selected at a time.

Figure 4:
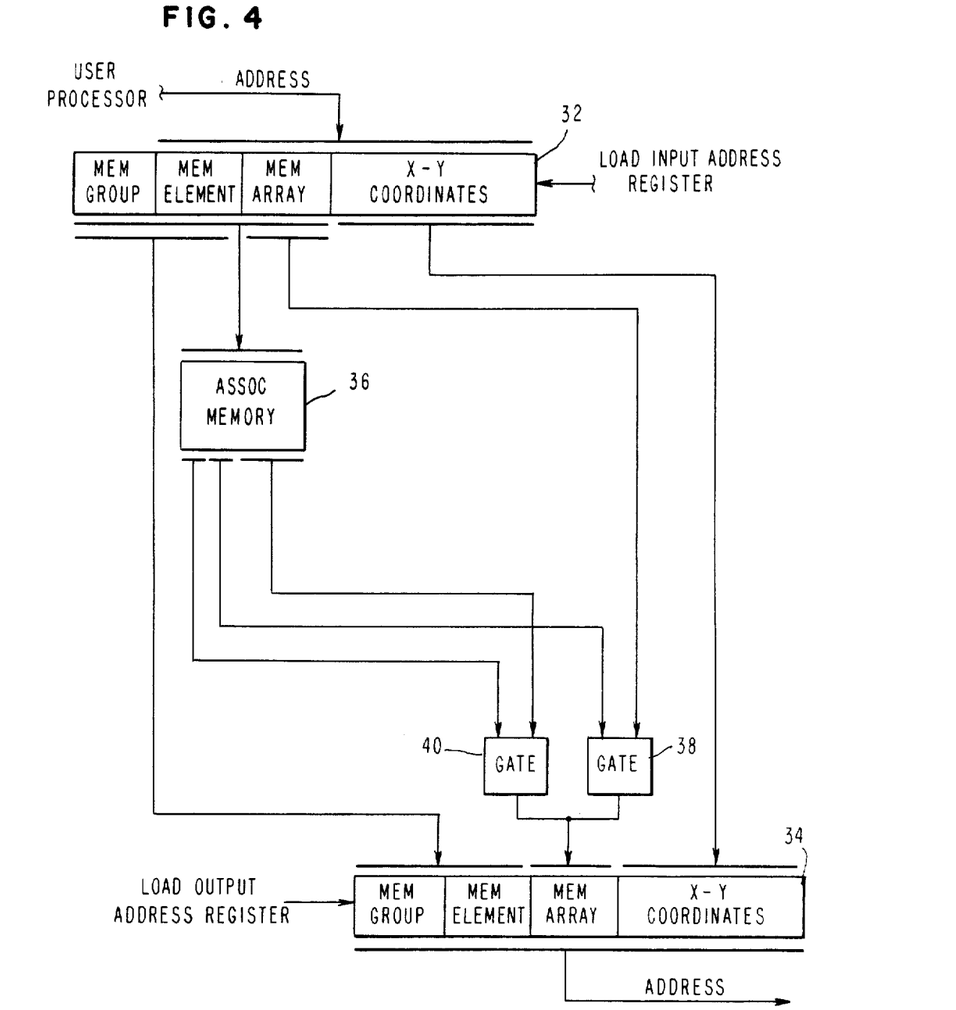
FIG. 4 is a more detailed diagram of the permutation apparatus in accordance with the present invention.

As shown in FIG. 1, when data is read out of the BSM it is transmitted to the error checking and correction circuitry (ECC) 31 of the storage subsystem control 12. If the ECC circuitry 31 indicates an uncorrectable error exists then the array select address entered into the SAR 24 of certain of the elements 16 is changed to misalign the failed bits making up the UE condition. The changing of the number entered into the SAR 24 is controlled by selection logic 30 which is shown in detail in FIG. 4. As shown, the logical address of a memory word in the BSM is fed into a register 32 where it is divided into a memory select field, a memory element select field, a memory array select field and an X-Y bit select field. Together the group, array and X-Y bit select field specify an K bit ECC code word. The memory element field identifies a particular bit position in the code word. The memory group, element and bit select fields are fed directly into a second register 34. Whether the logical memory array address field is entered directly into the second register 34 depends on the contents of an associative memory 36. The memory group element and array fields are used to access this associative memory 36. The associative memory reads out two bits, one which will be a zero and the other which will be a one. If the first bit is zero and the second bit is a 1, the second bit activates gate 38 which feeds the memory array field stored in register 32 directly into register 34. In this case the actual memory address and the logical memory address will be identical. This will occur if the address has not been changed to eliminate a UE. If the first bit is one and the second bit is zero, gate 40 is activated. Gate 40 will allow an address accessed from a memory 42 to be substituted in register 34 for the logical memory array field in register 32. In this case the actual memory address will be different than the logical memory address. This will occur if the location of a bit making up a memory word is changed to eliminate a UE condition. The substituted array address field is stored in the associative memory 36 at a location accessed by an address which has the group, element and array fields. Thus, when a bit is to be changed as a result of an uncorrectable error condition, the actual address accessed will be different from the logical address supplied to the storage control system by the processor. It will result in the swap of the array containing the faulted bit with another array in the same memory element.

Figure 5:
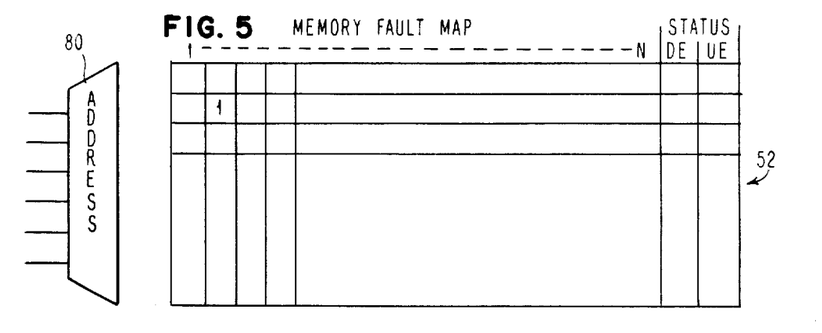
FIG. 5 is a chart outlining a fault map in accordance with the present invention.

A number of permutation algorithms can be used to relocate chips. For instance, the one described in co-pending application Ser. No. 383,640 now U.S. Pat. No. 4,485,471 filed June 1, 1982 could be employed with the present invention. However, since this invention permits swapping of two arrays without effecting other arrays, simpler algorithms can be used. For instance, a fault map showing the location of faulted arrays as shown in FIG. 5 can be maintained and this map checked to see if movement of an array chip into any word could result in a UE condition. The address to which a faulted word is to be moved is fed into the decoder 50 of an auxiliary store 52 resulting in the reading out of an N bit data word in the store where each bit represents an array 20. If a one is stored at any bit position it means the represented array is faulty. If a zero is stored at that address it means the array is good. The K bits making up the data word can then be examined to see if the addition of a faulted array to the word may cause any Double Errors (DEs) and Uncorrectable Errors (UEs) in the memory of FIGS. 1, 2 and 3. The addresses could be checked one after another until a suitable errorless address is found for the faulty array. Then the two arrays are swapped by placing their addresses in the associative memory 36.

Figure 7:
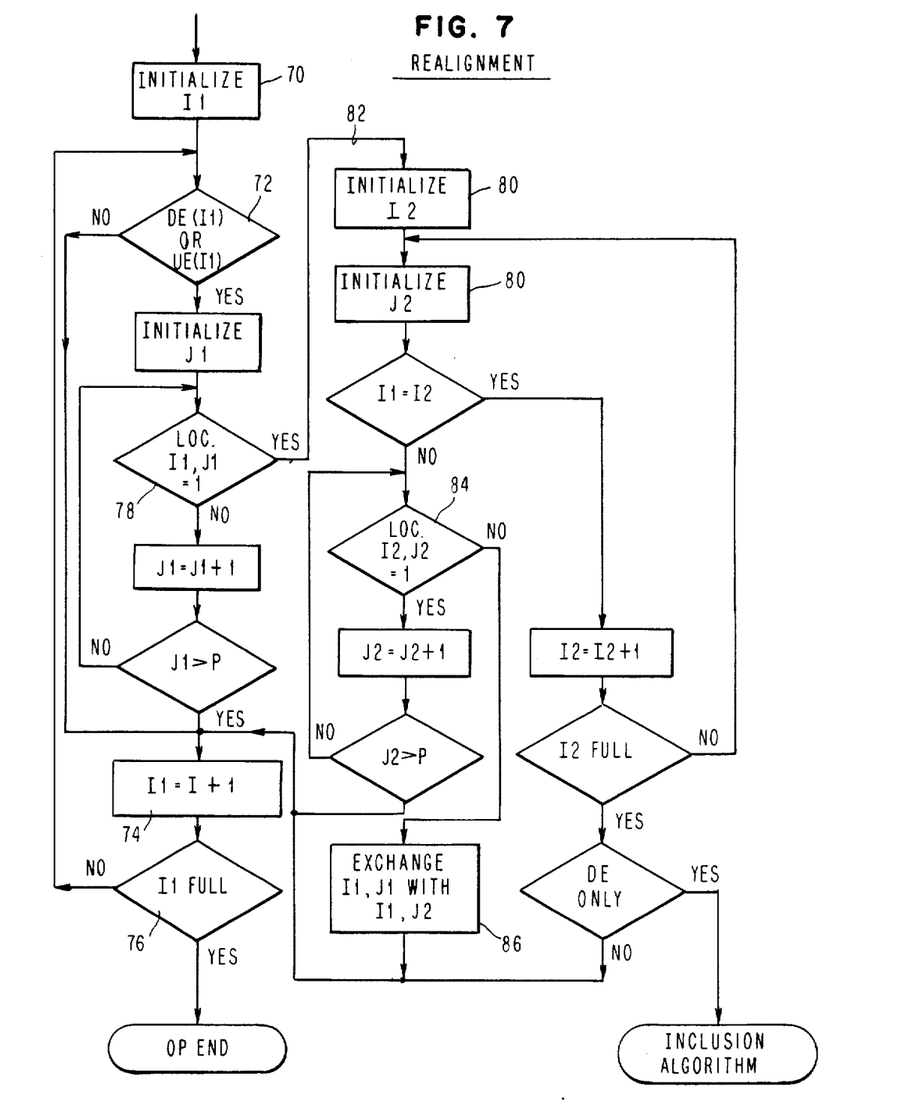

This can be better understood by reference to FIG. 7. Counter $I_1$ is loaded 70 with the initial row address in the fault map of FIG. 5. The map is accessed with the address and the word at that address is read out. The status bits of the word are checked for double errors or non-correctable errors 72 in the word lines of the memory represented by the accessed row address in the fault map of FIG. 5. If the status bits are both 0 there is no double errors (DEs) or uncorrectable errors (UEs) and the counter $I_1$ is incremented to the next address and the process repeated until all the rows of the map are checked. If the status bits stored at the address indicates there is a DE or UE condition, a second counter $J_1$ is set to the address of the first bit position in the map. This counter then checks the contents 78 of the first bit position of the row of the map addressed by the contents of counter $I_1$. If there is a "0" stored at that bit position the $J_1$ counter is incremented and the step repeated on the second bit position of the row until all bits in the row are checked. When a "1" is stored in any bit position accessed by counters $I_1+J_1$ counters $I_2$ and $J_2$ are set 80 to initial row and bit address of the map respectively. Counters $I_2+J_2$ identify the address of a possible swap location for the erroneous bit $I_1$, $J_1$ producing the branch 82. The counters $I_2$, $J_2$ are incremented until a suitable errorless word location is found 84 for the array identified by the counter $I_1$, $J_1$. When this occurs, proper entry 86 is made into the associative memory 36 in FIG. 4 to exchange the arrays. In addition the bit map of FIG. 5 is updated to eliminate the UE or DE condition.

Figure 6:
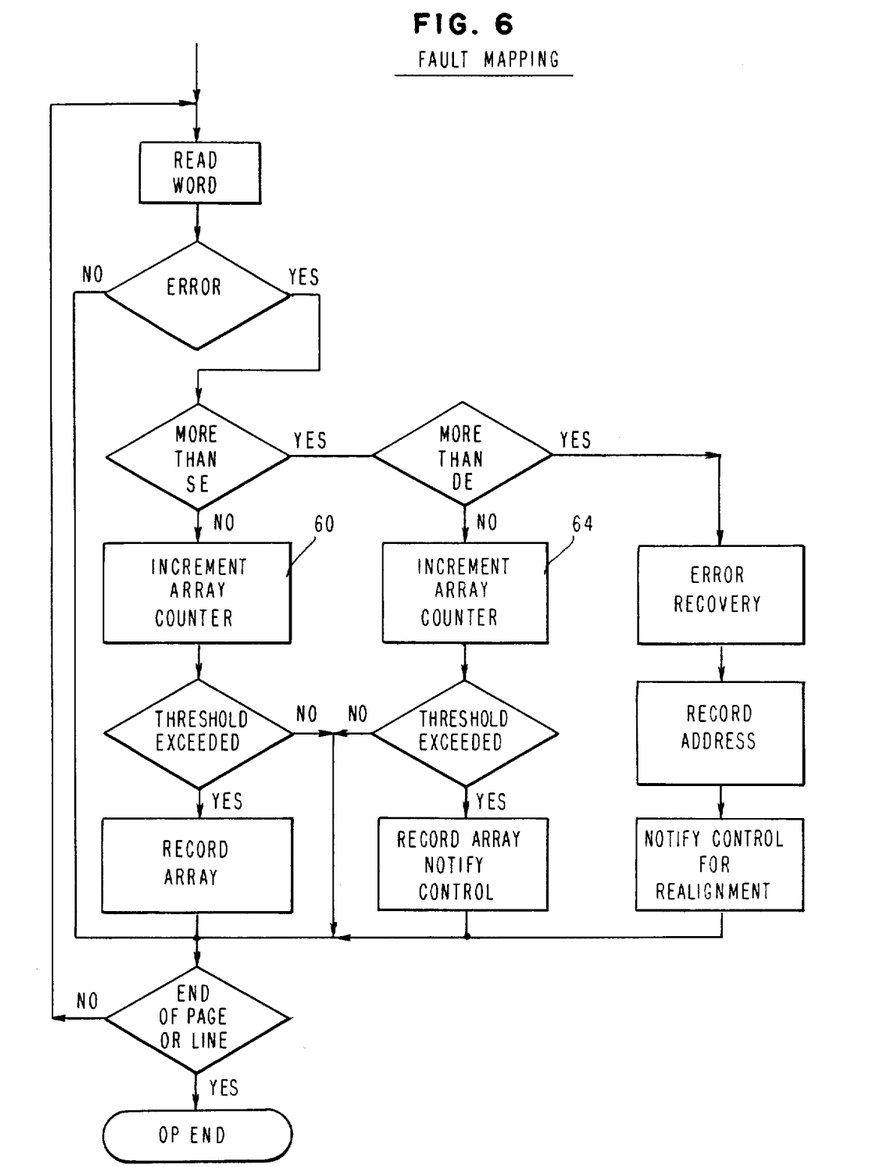
FIGS. 6 and 7 are flow diagrams of the algorithm for generation of test data in accordance with the present invention.

FIG. 6 illustrates fault mapping using the array of FIG. 5 when the ECC is a DEC/TED code. As shown, if no error is detected in any ECC code word the code word at the next address is interrogated. If a single error is detected within any code word, its location is determined and an error count kept for the array containing the error is incremented 60 by one. Then the count is checked to see if it exceeds a threshold level for an unacceptable number of errors within an entity. If it does exceed the increment, it indicates that the array is considered faulted and that fact is recorded in the fault map of FIG. 5. If a double error is detected, array counters for both arrays containing errors are incremented 64 and their threshold levels are checked 66. If either level is exceeded, the proper entry or entries are made in the memory of FIG. 5. If an uncorrectable error is detected, error recovery is implemented and the address bits are realigned.

Above we have described one embodiment of the invention and other embodiments are possible. For instance, element address fields could be placed into different groups along with or in place of swapping arrays. Therefore it should be understood that many modifications and changes can be made in the illustrated embodiment without departing from the spirit and scope of the invention as represented in the attached claims.

Having thus described our invention, what we claim as new, and desire to secure by Letters Patent is:

1. In a memory system with memory space arranged in logical data words with bit positions of any of the logical data words stored in a plurality of memory elements where the memory elements are each accessed through a different one of a plurality of decoders by an actual address of a data location in the element, new apparatus for preventing faulty data bits at the same actual address in two different memory elements from being used to store different bit positions of a given logical data word comprising:

address means for providing a logical address for said given logical data word;
   a single address translation means for translating said logical address to all actual addresses of data bits accessed by each of said plurality of decoders, said translation means including permutation means for substituting address bits of said logical address with address bits of another logical address in the memory space in the translating of the logical address to the actual address for one of said two different memory elements so that the actual address for bit position of the logical data word stored in said one of said two different memory elements differs both from the actual address for the bit position stored in the other of said two different memory elements and from the actual address of other bit positions in said logical data word;
   distribution means for supplying to each of said decoders the appropriate one of said actual addresses produced by said translation means whereby the alignment of the faulty data bits in said given logical address can be eliminated without the use of spare memory elements.

2. The memory system of claim 1 wherein said distribution means comprises time multiplexing means for providing the appropriate actual address to said decoders one decoder after the other during different time periods.

3. The memory system of claim 2 wherein said permutation means includes:

associative memory means addressed by a portion of said given logical address for providing said substituted address bits in response thereto, and
   means for combining said changed address bits with other bits of said logical address to assemble the actual address of said one of said two different memory elements.

4. The memory of claim 1 wherein said memory elements each comprise a plurality of memory arrays, the bits of any bit position of said logical data words are arranged in a plurality of arrays and said permutation means includes means for changing the address bits for selecting a bit from one of said arrays as a bit position of said given logical data word.

5. The memory of claim 1 wherein permutation means for selecting the actual address for any bit position in said memory includes selection means for selecting actual address bits for each of said bit positions one bit position after the other in sequence.

6. The memory of claim 4 wherein said sequence proceeds in the order of bit position.

* * * * *